US006084281A

United States Patent [19]

Fullin et al.

[11] Patent Number: 6,084,281

[45] Date of Patent: Jul. 4, 2000

[54] PLANAR MAGNETIC MOTOR AND MAGNETIC MICROACTUATOR COMPRISING A MOTOR OF THIS TYPE

[75] Inventors: Enzo Fullin, Ipsach Suisse; Raymond Vuilleumier, Fontainemelon Suisse, both of Switzerland

[73] Assignee: CSEM Centre Suisse d'Electronique et de Microtechnique S.A., Neuchatel, Switzerland

[21] Appl. No.: 09/052,980

[22] Filed: Apr. 1, 1998

[30] Foreign Application Priority Data

Apr. 1, 1997 [FR] France .................................. 97 03961

[51] Int. Cl.[7] .............................. H01L 43/00; H01H 3/00

[52] U.S. Cl. ............................ 257/422; 257/421; 335/68; 335/71; 335/75; 335/177

[58] Field of Search .................................... 257/421, 422; 310/46; 335/68, 71, 75, 177

[56] References Cited

U.S. PATENT DOCUMENTS

| | | | |
|---|---|---|---|
| 5,113,100 | 5/1992 | Taghezout | 310/40 MM |
| 5,472,539 | 12/1995 | Saia et al. | 156/155 |
| 5,475,353 | 12/1995 | Roshen et al. | 335/78 |
| 5,557,132 | 9/1996 | Takahashi | 257/415 |
| 5,889,452 | 3/1999 | Vuilleumier | 335/80 |

FOREIGN PATENT DOCUMENTS

| | | | |
|---|---|---|---|
| 0 573 267 | 12/1993 | European Pat. Off. . | |
| 2 101 404 | 1/1983 | United Kingdom | 257/421 |

*Primary Examiner*—Mahshid Saadat
*Assistant Examiner*—Allan R. Wilson
*Attorney, Agent, or Firm*—Pollock, Vande Sande & Amernick

[57] ABSTRACT

Planar magnetic motor (100), characterized by the fact that it comprises a plurality of magnetic poles (111, 121) made of a ferromagnetic material placed at the center of planar coils (110, 120) constituted by at least one layer of turns produced on the surface of a substrate (150) made of a ferromagnetic material, the turns being wound and connected to each other so as to combine the magnetic fluxes generated by the magnetic poles (111, 121). The invention can be used to produced magnetic motors and microactuators.

7 Claims, 2 Drawing Sheets

PLANAR MAGNETIC MOTOR AND MAGNETIC MICROACTUATOR COMPRISING A MOTOR OF THIS TYPE

FIELD OF THE INVENTION

The present invention concerns a magnetic planar motor, as well as a microactuator comprising a motor of this kind.

BACKGROUND OF THE INVENTION

The invention is used to particular advantage in the field of actuators, for example microvalves, microrelays, micromotors, and, more generally, all Microsystems performing a movement function.

To date, most existing microactuators function based on the principles of electrostatic, piezoelectric, or thermal actuation. On the other hand, the field of magnetic microactuators is still underused. This can be explained by the fact that the technologies which make it possible to produce effective magnetic devices are of relatively recent date, in particular the mastery of thick layers having a high "aspect ratio," or ratio of height to width. Furthermore, existing relay-type microactuators are found not to be completely satisfactory; in particular, the currents needed for actuation are often relatively strong, since there is a small number of turns in the coils which compose them.

BRIEF DESCRIPTION OF THE INVENTION

Accordingly, a first technical problem to be solved by the object of the present invention consists in proposing a planar magnetic motor making it possible to increase the magnetic force developed, while retaining a reasonable surface area.

The solution to this first technical problem lies, according to the present invention, in the fact that the planar magnetic motor comprises a plurality of magnetic poles made of a ferromagnetic material and positioned in the center of planar coils comprising at least one layer of turns produced on the surface of a substrate made of a ferromagnetic material, the turns being wound and connected to each other so as to combine the magnetic fluxes generated by the magnetic poles.

Thus, by increasing the number of poles, e.g. two, as well as the number of layers of turns per coil, it is possible to increase the actual number N of turns of the planar magnetic motor according to the invention, and, in consequence, the magnetic force proportional to $I^2(N1+N2)^2$, I being the current which passes through the turns, and N1 and N2 designating the number of turns in the first and second coils, while retaining an acceptable surface area for the device.

A second technical problem solved by the invention lies in proposing a magnetic microactuator comprising a planar magnetic motor according to the invention, which incorporates a mobile compact mechanical element so as to reduce the size of the system.

The solution to the second technical problem raised consists, according to the present invention, in the fact that the magnetic microactuator also comprises a mobile contact-equipped mechanical element, which incorporates a support frame positioned on the surface of the magnetic substrate with interposition of a spacer, a flexible bar arranged substantially parallel to the surface of the substrate and of which one end is fastened to the support frame, a core made of a ferromagnetic material and carried by the flexible bar, and a mobile contact made integral with the ferromagnetic core and positioned opposite a stationary contact arranged on the surface of the substrate of the planar magnetic motor.

The magnetic microactuator according to the invention has a certain number of advantages. First, it forms a miniature planar device occupying little space and allowing possible addition of an integrated circuit. Second, the spacer thickness makes it possible to regulate directly the insulation voltage of the microactuator functioning as a relay. Furthermore, the mobile and stationary contacts may be produced as a thin, integrated layer.

According to a first embodiment of the magnetic microactuator according to the invention, the spacer is produced by deposition of a conductive material on the surface of the substrate of the planar magnetic motor, the support frame being mounted on the spacer by means of conductive projections.

The embodiment utilizes "flip-chip" technology, which is well known in the field of semiconductor chip connection technology.

According to a second embodiment of the magnetic microactuator according to the invention, the spacer is made of a insulating material and integrated into the support frame, the flexible bar being conductive and connected electrically to the surface of the substrate of the planar magnetic motor by its end fastened to the support frame.

BRIEF DESCRIPTION OF THE FIGURES

The following description with reference to the attached drawings provided as non-limiting examples will allow understanding of what the invention consists of and how it can be produced.

DETAILED DESCRIPTION OF THE INVENTION

Figure 1:
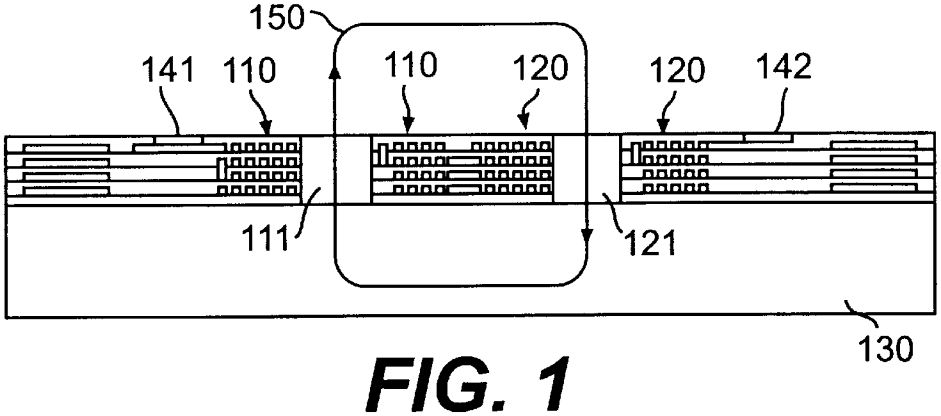
FIG. 1 is a side view of a planar magnetic motor according to the invention.

FIG. 1 is a side view of a planar magnetic motor 100 constituted by planar coils 110, 120, each of which comprises four layers of turns which are structured on the surface of a ferromagnetic substrate 130. Each coil 110, 120 incorporates, in its center, a magnetic pole 111, 121 made of a ferromagnetic material, such as ferronickel FeNi.

This structure is actually a magnetic circuit with an air gap. The passage of a current through the coils 110, 120 between an input terminal 141 and an output terminal 142 generates a flux 150 in the magnetic circuit, which produces an attractive force at the air gap.

In the specific case illustrated in FIG. 1, the magnetic circuit is constituted by two poles 111, 121 surrounded by coils 110, 120, whose turns are wound and connected to each other so as to combine the magnetic fluxes generated by the magnetic poles.

Figure 2:
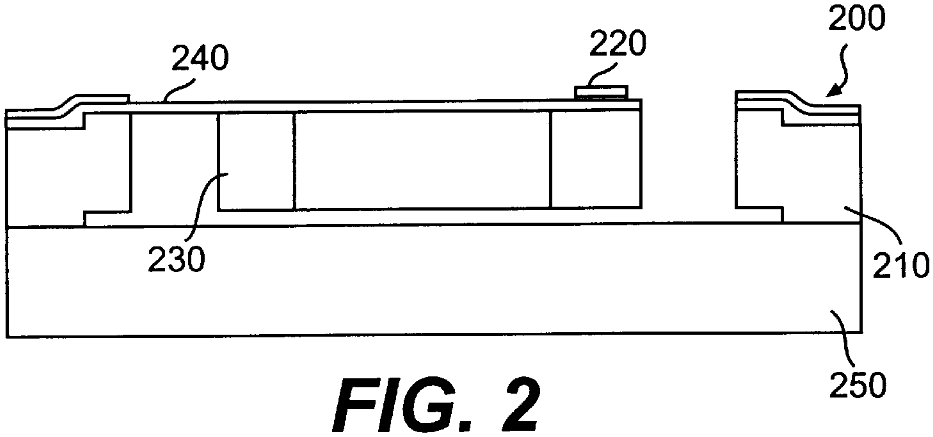
FIG. 2 is a side view of a first embodiment of a mobile element of a microactuator according to the invention.
Figure 6:
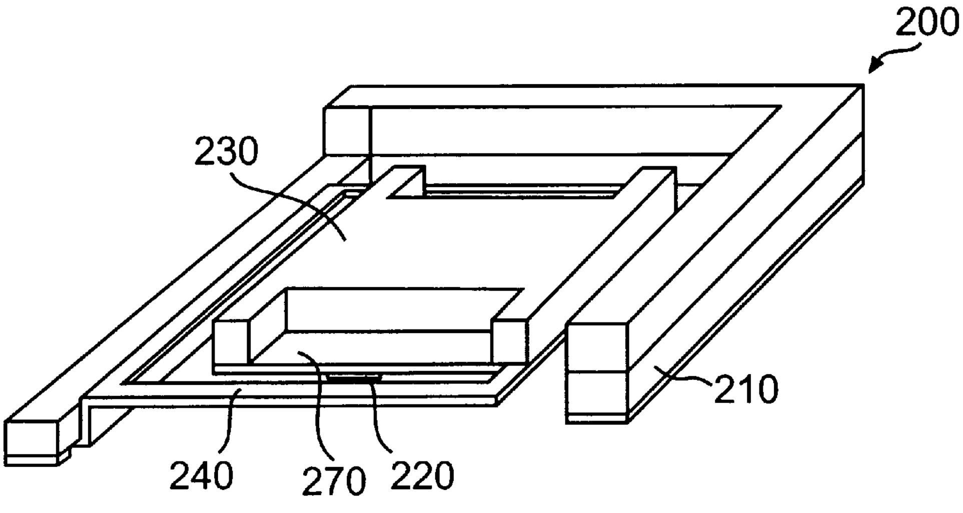
FIG. 6 is a perspective view of a mobile element equipped with a deformable excess thickness-compensating membrane.

Coupling this motor component with a mobile element forms a microactuator, for example a valve, a relay, a levitating motor, etc. FIGS. 2 and 6 illustrate the special case of the production of a mobile contact-equipped mechanical element 200 for a microrelay.

Figure 3:
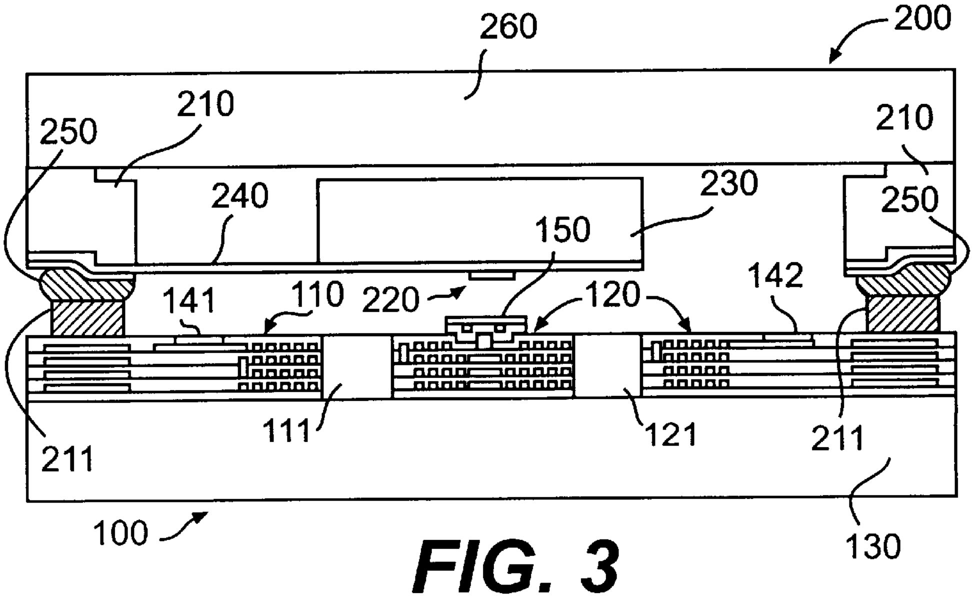
FIG. 3 is a side view of a microactuator comprising the mobile element in FIG. 2 associated with the planar magnetic motor in FIG. 1.

This structure comprises a support frame 210 which, as shown in FIG. 3, is designed to be positioned on the surface of the ferromagnetic substrate 130 of the planar motor 100 using a spacer 211. In the example in FIG. 3, the spacer 211 is produced by deposition of a conductive material on the surface of the substrate 130. The height of the spacer 211 makes it possible to adjust the air gap between the stationary contact 150 arranged on the surface of the planar motor 100 and a mobile contact 220 made integral with a ferromagnetic core 230, made, for example, of FeNi and carried by a flexible bar 240, which must be made of a ferromagnetic material, for example nickel. One end of the flexible bar 240 is fastened to the support frame 210 and acts as a stationary point for the lever arm constituted by the bar 240.

FIGS. 2 and 3 show that the support frame 210 is surmounted by a substrate 260, which may be made of silicon when it is intended to support an integrated circuit.

Depending on the uses made thereof, the substrate 260 may be made of a transparent material (glass) or a ferromagnetic material (FeNi or FeSi). Use of a ferromagnetic material as a substrate for both the motor and actuator parts assures magnetic screening for the apparatus. The substrates further serve as electrical connection terminals.

Finally, the support frame 210 is mounted on the spacer 211 by means of conductive projections 250, in accordance with the flip-chip process. Assembly may be accomplished by soldering or adhesive bonding techniques, the condition being that this part be electrically conductive so as to produce one of the contacts of the microrelay on the other part. Furthermore, this assembly, which is positioned around the entirety of the device, allows insulation of the microrelay contact and the formation of a sealed cavity in which environment and pressure are regulated. Accordingly, it is not necessary to provide a cover, which forms an integral part of the system by virtue of the projection-based assembly.

Figure 4:
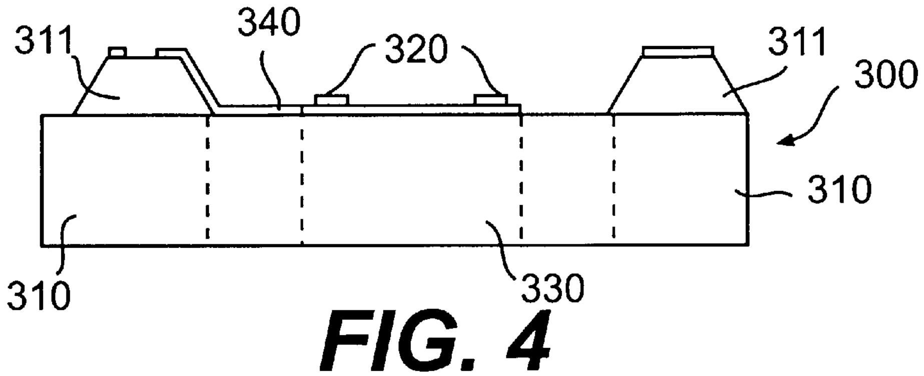
FIG. 4 is a side view of a second embodiment of a mobile element of a microactuator according to the invention.
Figure 5:
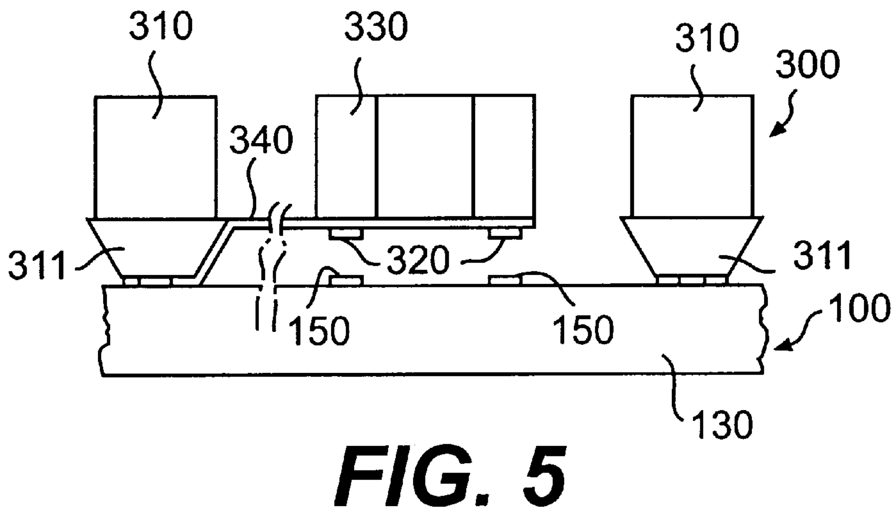
FIG. 5 is a side view of a microactuator comprising the mobile element in FIG. 4, which is associated with the planar magnetic motor in FIG. 1.

FIGS. 4 and 5 illustrate a variant of the mobile contact-equipped mechanical element, which is produced from a thin ferromagnetic substrate on which are arranged a spacer 311 made of an insulating material and the flexible metal bar 340, which carries the mobile contacts 320. By selective attack on the rear of the substrate along the dotted lines in FIG. 4, the support frame 310 and the ferromagnetic core 330 are produced. Electric continuity between the contacts 150 and 320 belonging to the microrelay is provided by virtue of the fact that the flexible conductive bar 340 is electrically connected to the surface of the substrate 130 of the planar magnetic motor 100 by its end fastened to the support frame 310.

Returning to the embodiment in FIG. 3, it can be seen that, when the two contacts 150, 220 of the microrelay are placed opposite each other and when the relay is closed, these two contacts, because of the thickness thereof, will prevent the magnetic circuit from closing with a minimal air gap. For this reason, in order to store this excess thickness, the mobile contact 220 of the mechanical element 200 is placed, as shown in FIG. 6, on a deformable membrane 270, which may also be made of nickel. This arrangement has two advantages:

- good closing of the electric contact because of transfer of the magnetic force generated by the magnetic circuit;
- a high level of effectiveness of the magnetic circuit because of the fact that the air gap is kept to a minimum, and, as a result, the magnetic force generated is at a maximum.

Different variants of the micro-relay according to the invention may be considered. As regards actuation, the relay may be controlled by a continuous current applied to the planar coils 110, 120 or by magnetic induction produced by a permanent magnet.

A further variant is for the case of a Reed relay. This variation anticipates that electrical contact is completed, not through particular contacts, but through the magnetic poles (111 and 121 of FIG. 3). In this case connections with the exterior are made by the intermediate presence of ferromagnetic substrates.

Furthermore, permanent magnets or a material that be magnetized locally using a coil can be used to make the system bistable; that is, exhibiting a stable state in the activated position and a stable state in the resting position.

Finally, the invention as described lends itself particularly well to the production of matrices of magnetic microactuators on a single substrate.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A magnetic microactuator comprising;

a ferromagnetic substrate;

a plurality of magnetic poles located on a surface of the substrate;

a plurality of coils respectively wound around each pole, each coil having at least one winding;

the windings being connected together to combine the fluxes generated across the poles;

a movable contact assembly including (a) a support frame located over the substrate surface;

(b) a spacer intermediately positioned between the substrate surface and the frame;

(c) a cantilevered flexible bar having a longitudinal axis and secured at a first end thereof between the frame and the spacer for locating the bar parallel to the substrate surface when the coils are not energized;

(d) a ferromagnetic core mounted along the axis of the flexible cantilevered bar and movable therewith;

(e) a contact located along the axis and integrally fixed to the core and movable therewith; and (f) a stationary contact mounted to the substrate surface in alignment with the contact fixed to the core, the fixed and movable contacts normally maintaining a gap and contacting one another upon energization of the coils.

2. Magnetic microactuator according to claim 1, wherein said spacer is made of an insulating material and integrated into said support frame, said flexible bar being conductive and electrically connected to the surface of the substrate.

3. Magnetic microactuator according to claim 1, wherein said contact fixed to the core is placed on a deformable membrane.

4. Magnetic microactuator according to claim 1, wherein said microactuator is controlled by a continuous current applied to said coils.

5. Magnetic microactuator according to claim 1, wherein said microactuator is controlled by magnetic induction produced by a permanent magnet.

6. Magnetic microactuator according to claim 1, configured as a Reed relay wherein electrical contact occurs through the poles.

7. A magnetic microactuator comprising;

a ferromagnetic substrate;

a plurality of magnetic poles located on a surface of the substrate;

a plurality of coils respectively wound around each pole, each coil having at least one winding;

the windings being connected together to combine the fluxes generated across the a movable contact assembly including (a) a support frame located over the substrate surface;

(b) a spacer intermediately positioned between the substrate surface and the frame;

(c) a flexible bar secured at a first end thereof between the frame and the spacer for locating the bar parallel to the substrate surface when the coils are not energized;

(d) a ferromagnetic core mounted to the flexible bar and movable therewith;

(e) a contact fixed to the core and movable therewith; and (f) a stationary contact mounted to the substrate surface in alignment with the contact fixed to the core the fixed and movable contacts normally maintaining a gap and contacting one another upon energization of the coils;

wherein the spacer is made of conductive material, and further wherein the support frame includes conductive projections.

* * * * *